United States Patent
Sarin et al.

(10) Patent No.: US 11,687,765 B2
(45) Date of Patent: Jun. 27, 2023

(54) METHOD FOR ANALOG IN-MEMORY COMPUTE FOR NEURAL NETWORKS

(71) Applicants: Vishal Sarin, Santa Clara, CA (US); Vikram Kowshik, Cupertino, CA (US); Sankha Subhra Saha, Santa Clara, CA (US)

(72) Inventors: Vishal Sarin, Santa Clara, CA (US); Vikram Kowshik, Cupertino, CA (US); Sankha Subhra Saha, Santa Clara, CA (US)

( * ) Notice: Subject to any disclaimer, the term of this patent is extended or adjusted under 35 U.S.C. 154(b) by 248 days.

(21) Appl. No.: 16/798,299

(22) Filed: Feb. 22, 2020

(65) Prior Publication Data
US 2021/0264243 A1    Aug. 26, 2021

(51) Int. Cl.
| | |
|---|---|
| *G06N 3/00* | (2006.01) |
| *G06N 3/063* | (2023.01) |
| *G11C 11/54* | (2006.01) |
| *G06N 3/06* | (2006.01) |
| *H03M 1/12* | (2006.01) |
| *H03M 1/06* | (2006.01) |
| *G11C 11/56* | (2006.01) |

(52) U.S. Cl.
CPC .......... *G06N 3/0635* (2013.01); *G06N 3/06* (2013.01); *G11C 11/54* (2013.01); *G11C 11/56* (2013.01); *H03M 1/0602* (2013.01); *H03M 1/12* (2013.01)

(58) Field of Classification Search
CPC .......... G06N 3/06; G11C 11/54; G11C 11/56; H03M 1/0602
USPC ........................................................ 706/43
See application file for complete search history.

(56) References Cited

U.S. PATENT DOCUMENTS

2021/0143828 A1* 5/2021 Sarin .................. G11C 11/5642

* cited by examiner

*Primary Examiner* — Joseph J Lauture

(57) ABSTRACT

In one aspect, a system for analog in-memory compute for a neural network includes an array of neurons. Each neuron of the array of neurons receives a pulse of magnitude xi, and duration t, wherein a product xi*yi provides a current proportional to the input for a time duration t, which is a charge associated with a particular neuron in response to the input being presented to that particular neuron. A reference cell includes a gate-drain connected flash cell configuration and coupled with the array of neurons. The reference cell is programmed to a pre-determined threshold voltage Vt-ref. The reference cell receives a pre-determined current, Iref, wherein, based on the Iref and a pre-determined threshold voltage Vt-ref, a voltage is created at a drain of the reference cell.

20 Claims, 3 Drawing Sheets

METHOD FOR ANALOG IN-MEMORY COMPUTE FOR NEURAL NETWORKS

BACKGROUND

Solutions available today use CPU's and GPU's to implement and accelerate neural network models in hardware. Improvements are desired in neural network hardware accelerators to improve performance and reduce power consumption. The implementation techniques for neural networks presented in the current invention enables such compute operations at very high-performance levels while consuming very low energy. This opens up the possible applications which can benefit from neural networks.

BRIEF SUMMARY OF THE INVENTION

In one aspect, a system for analog in-memory compute for a neural network includes an array of neurons. Each neuron of the array of neurons receives a pulse of magnitude $x_i$, and duration t, wherein a product $x_i * y_i$ provides a current proportional to the input for a time duration t, which is a charge associated with a particular neuron in response to the input being presented to that particular neuron. A reference cell includes a gate-drain connected flash cell configuration and coupled with the array of neurons. The reference cell is programmed to a pre-determined threshold voltage $V_{t-ref}$. The reference cell receives a pre-determined current, $I_{ref}$, wherein, based on the ref and a pre-determined threshold voltage $V_{t-ref}$, a voltage is created at a drain of the reference cell, and wherein the voltage is then buffered with an operational amplifier that generates a control gate voltage $V_{CG}$ that is provided to the control gates of an array of neurons. A set of analog to digital converters (ADCs). Each column of neurons of the array of neurons has an ADC. An ADC is coupled with a sense node. A current is used to pre-charge a bit-line of a neuron of the array of neurons and the sense node is used to sense the total charge discharged through the bit line of the neural array over a predetermined amount of time, wherein when the neural array is placed in an on state and the current flows, the value of the current flowing is a function of a control gate bias generated from the reference array and Vt of the neuron. A pulse-width of a select gate of the reference cell determines a time each neural cell of the neural array is turned on and the amount of charge removed from the sense-node capacitor. When the sense node discharges and reaches a trip point of a detector of the sense node, the detector then provides a pulse signal. The pulse signal is counted by a counter coupled with the detector. The counter registers a set of discharge cycles of the sense node.

Figure 1:
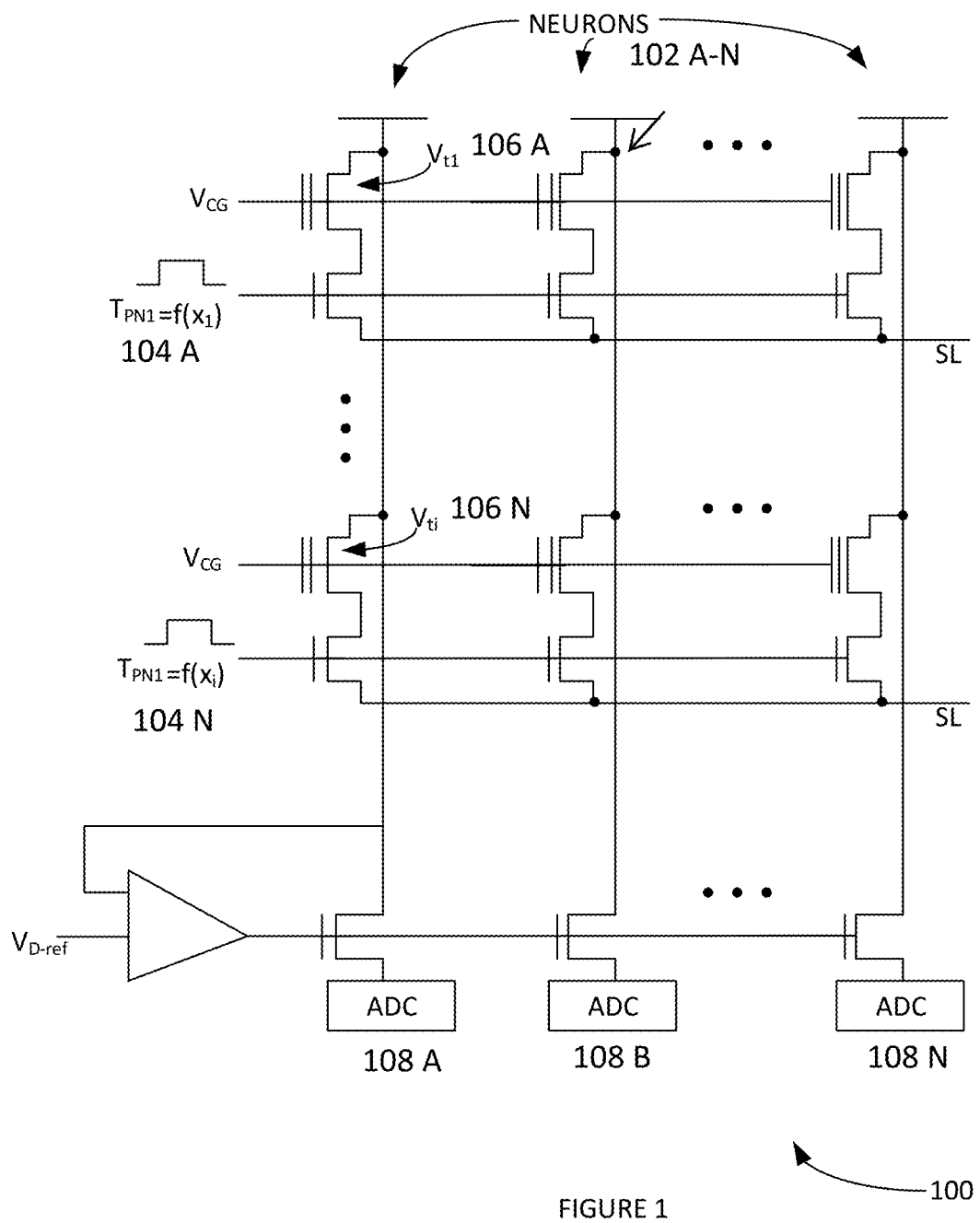
FIG. 1 illustrates a neural array for implementing a sigma delta analog to digital converter for neural compute, according to some embodiments.

The Figures described above are a representative set and are not an exhaustive with respect to embodying the invention.

DESCRIPTION

Disclosed are a system, method, and article of manufacture for analog in-memory compute for neural networks. The following description is presented to enable a person of ordinary skill in the art to make and use the various embodiments. Descriptions of specific devices, techniques, and applications are provided only as examples. Various modifications to the examples described herein can be readily apparent to those of ordinary skill in the art, and the general principles defined herein may be applied to other examples and applications without departing from the spirit and scope of the various embodiments.

Reference throughout this specification to 'one embodiment,' 'an embodiment,' 'one example,' or similar language means that a particular feature, structure, or characteristic described in connection with the embodiment is included in at least one embodiment of the present invention. Thus, appearances of the phrases 'in one embodiment,' 'in an embodiment,' and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming and read algorithms, hardware modules, hardware circuits etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematics and flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, and they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Example definitions for some embodiments are now provided.

Flash memory is an electronic solid-state non-volatile storage medium that can be electrically erased and reprogrammed.

Neuron can be a flash-cell system modelled on attributes of individual neurons and networks of neurons in a nervous system. In some examples, the equation for a neuron can be: $Eq^{neuron} \equiv \Sigma(x_i * y_i) + b$. Here, $x_i$ is the set of input vectors, $y_i$ is parameter which can be related to threshold voltage of individual flash cells, and b is a bias variable.

Operational amplifier (Op Amp) is a DC-coupled high-gain electronic voltage amplifier with a differential input and, usually, a single-ended output.

Example Computer Architecture and Systems

FIG. 1 illustrates a neural array 100 for implementing a sigma delta analog to digital converter for neural compute, according to some embodiments. Neural array 100 comprises an array of neurons 102 A-N are provided. Neurons 102 A-N take pulses as input. These pulses can be pulses $f(x_1)f(x_i)$ 104 A-N. The pulse widths of $f(x_1)$-$f(x_i)$ 104 A-N are proportional to the value of each $x_i$. The larger the digital value of $x_i$ the longer the pulse width.

Figure 2:
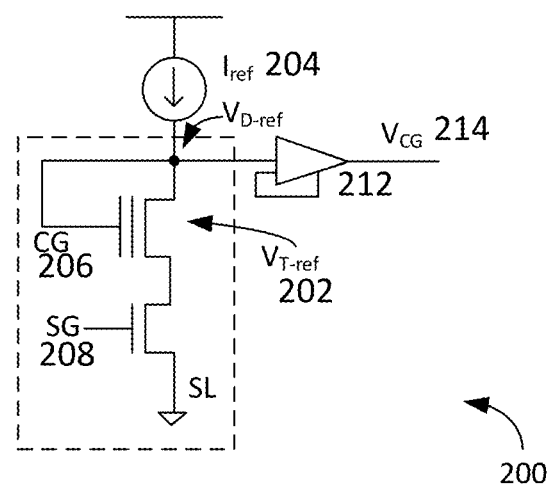
FIG. 2 illustrates an example a reference generation system composed of a reference cells and reference current, for cell current tracking according to some embodiments.

FIG. 2 illustrates an example reference cell 200, according to some embodiments. Reference cell 200 is a reference cell for system of neurons 100. Reference cell 200 can be programmed to a pre-determined threshold voltage $V_{t\text{-}ref}$ 202. A fix/pre-determined current, $I_{ref}$ 204, is provided to reference cell 200. It is noted that there can be multiple reference cells in some example embodiments.

Reference cell 200 includes a gate-drain connected configuration as shown. The gate-drain connected configuration includes a control gate (CG) 206. CG 206 is a gate of the flash cell. CG 206 is connected with the drain of flash cell as shown, either directly or through a switch transistor The select gate (SG) 208 portion of the flash cell is kept in an on state for the present operation. Depending on the current value and the threshold value of the flash cell, a voltage is created at the drain of the flash cell. The relationship is such that the larger the current the larger the voltage created at the drain of the flash cell. The voltage is then buffered with an operation amplifier (Op Amp) 212. Op Amp 212 can be in a unity gain configuration. However, it is noted that Op Amp 212 can be in other gain configurations as well.

Op Amp 212 buffers the voltages of the flash cell to create a voltage $V_{CG}$ 214. $V_{CG}$ 214 goes to the entire neural array 100 (e.g. via the control gate of neural array 100). In this way, a bias created from a reference cell or cells 200 is provide to the control gate of the entire neural array 100. The bias of the reference cell can track the fluctuations from temperature just as the thresholds of the neural array 100 also fluctuate with temperature. The rest of the characteristics of the reference cell(s) 200 also tracks with the neural cells. In this way, the reference cell 200 helps to ensure that the current in the neural array 100 remains stable in time and across Process-Voltage-Temperature (PVT) variations.

At the start of any mode, the detector reference voltage is determined by disconnecting the bitline from the neural array and connecting it to a known current source. The reference voltage is then swept till the correct output count is achieved for the known current source. This helps eliminate any error coming in from different ramp time for different modes. It also helps extends the range of length of input vector which can be used for the system.

The neural compute method is as follows. Multiple neurons 102 A-N are placed in an on state. For simplicity of explanation, the following description provides the operation of a single neuron, neuron 102 A. It is noted that other neurons of neurons 102 A-N behave in a similar manner in the neural compute method. Depending on the width of the input pulse, each cell of neuron 102 A is also on for the proportional period. Accordingly, the currents of the cells of neuron 102 A can continue to change as a function of the width of the input pulse. Each cell of neuron array 100 can have a different threshold value in the desired range of operation.

Figure 3:
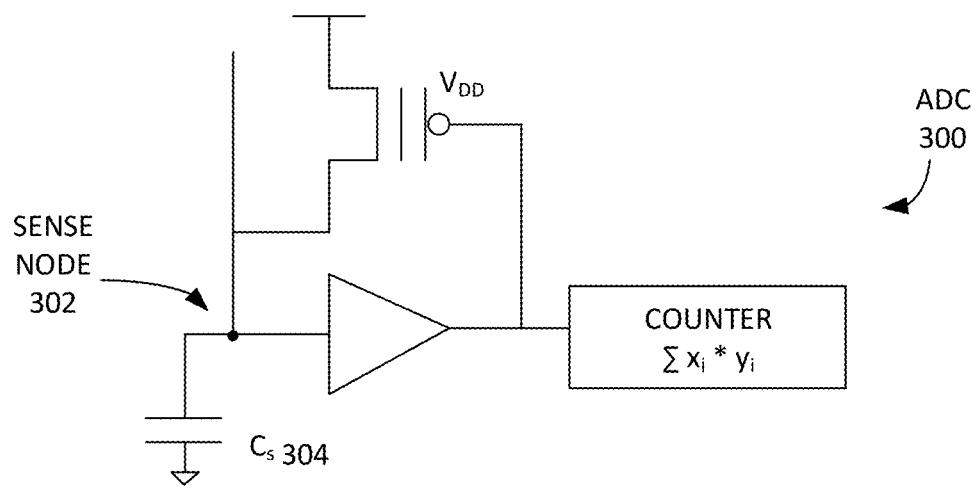
FIG. 3 illustrates an example analog to digital converter (ADC), according to some embodiments.

FIG. 3 illustrates an example analog to digital converter (ADC) system 300, according to some embodiments. Each column of neurons 102 A-N has its own ADC of ADCs 108 A-N. A current can be used to pre-charge the bit-line of neuron 102 A from the sense node 302. Sense node 302 can also include a sense capacitance ($C_s$ 304). In this way, the sense node 302 is charged to a pre-determined voltage $V_{DD}$. For example, the $V_{DD}$ can be 0.8 V. The neural array 100 is then placed in an on state and the current flows. The amount of current flowing is a function of the control gate bias generated from the reference array and Vt (weight) of the particular neuron. The pulse-width of the SG determines the time each neural cell is turned on and how fast the charge on the sense capacitor is removed. Sense node 302 then discharges based on the bit-line current. When it reaches the trip point of the detector, the detector detects and provides a pulse. The pulse is then counted by the counter which registers the discharge cycles of the sense node 302. Along with the pulse being counted in the counter, it also provides a trigger to pre-charge the bit-line back up again to $V_{DD}$ (e.g. see saw tooth pattern in FIG. 4 infra, etc.).

This then initiates another pre-charge (and so on). The current can vary each time. The lower the current the slower the discharge rate of the sense capacitance 304. Likewise, the higher the current, the greater the number of times of discharge as a function of time. The number of counts is higher for a higher current. For a given fixed time, if there is more average current, there is a greater count. The count of an ADC (e.g. of ADCs 108 A-N) is a measure of the amount of average current flowing in the respective bit-line. In a sense, this measures the summation of $x_i$ (CG bias voltage) multiplied by $y_i$ (the weight stored as threshold). The count is a reflection of integral $\int(x_i * y_i) \, dt$.

It is noted that the counting should last until the longest possible input charge is over. The count is a measure of the average bit line current over a fixed time, which is proportional to the total amount of charge discharged from the sense capacitor over the fixed time period.

Figure 4:
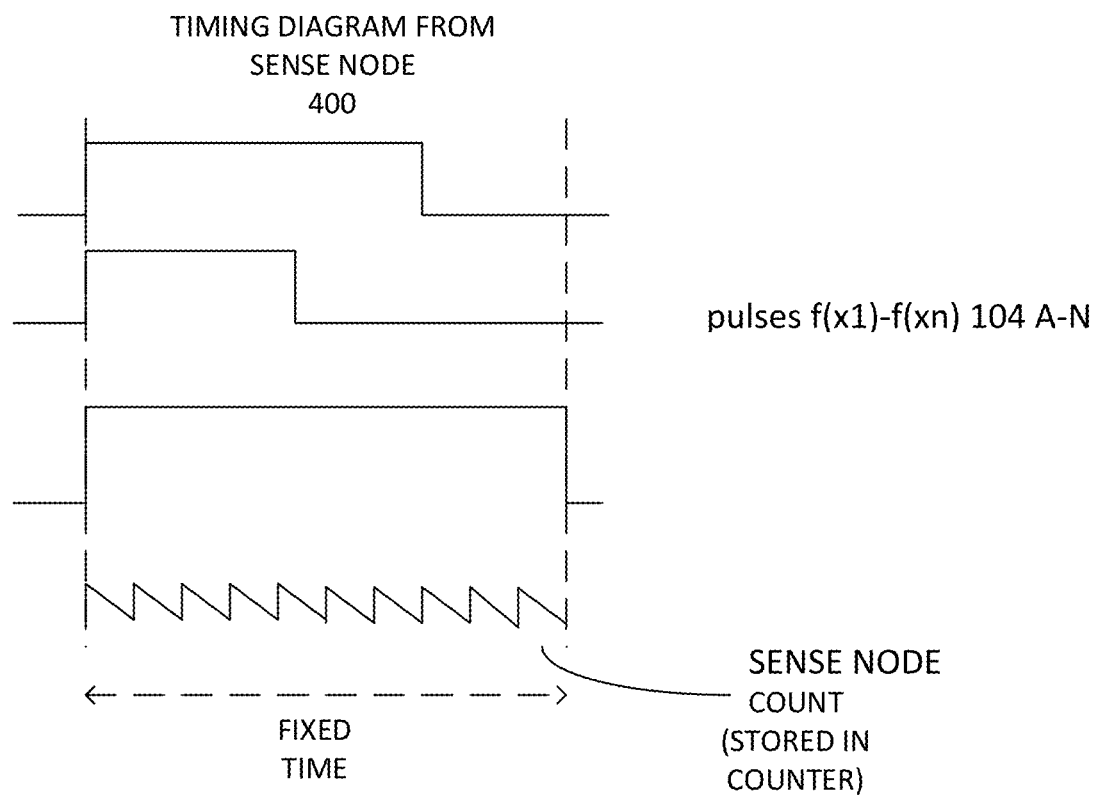
FIG. 4 illustrates an example timing diagram of a sense node, according to some embodiments.

FIG. 4 illustrates an example timing diagram 400 of a sense node, according to some embodiments. Timing diagram 400 illustrates the relationship between the input pulses and sense node counts. As shown, pulses $f(x_1)$-$f(x_i)$ 104 A-N can vary in width. As shown, the fixed time for measuring the count is the longest input pulse width.

CONCLUSION

Although the present embodiments have been described with reference to specific example embodiments, various modifications and changes can be made to these embodiments without departing from the broader spirit and scope of the various embodiments. For example, the various devices, modules, etc. described herein can be enabled and operated using hardware circuitry, firmware, software or any combination of hardware, firmware, and software (e.g., embodied in a machine-readable medium).

In addition, it can be appreciated that the various operations, processes, and methods disclosed herein can be embodied in a machine-readable medium and/or a machine accessible medium compatible with a data processing system (e.g., a computer system), and can be performed in any order (e.g., including using means for achieving the various operations). Accordingly, the specification and drawings are to be regarded in an illustrative rather than a restrictive sense. In some embodiments, the machine-readable medium can be a non-transistor form of machine-readable medium.

What is claimed as new and desired to be protected by Letters Patent of the United States is:

1. A system for analog in-memory compute for a neural network comprising:
   an array of neurons, wherein each neuron of the array of neurons receives a pulse of magnitude $x_i$, and duration t, wherein a product xi*yi provides a current proportional to the input for a time duration t, which is a charge associated with a particular neuron in response to the input being presented to that particular neuron;
   A reference cell comprising a gate-drain connected flash cell configuration and coupled with the array of neurons, wherein the reference cell is programmed to a pre-determined threshold voltage $V_{t\text{-}ref}$, wherein the reference cell receives a pre-determined current, $I_{ref}$, wherein, based on the $I_{ref}$ and a pre-determined threshold voltage $V_{t\text{-}ref}$, a voltage is created at a drain of the reference cell, and wherein the voltage is then buffered with an operational amplifier that generates a control gate voltage $V_{CG}$ that is provided to the control gates of an array of neurons; and
   a set of analog to digital converters (ADCs), wherein each column of neurons of the array of neurons has an ADC, wherein an ADC is coupled with a sense node, wherein a current is used to pre-charge a bit-line of a neuron of the array of neurons and the sense node is used to sense the total charge discharged through the bit line of the neural array over a predetermined amount of time,
   wherein when the neural array is placed in an on state and the current flows, the value of the current flowing is a function of a control gate bias generated from the reference array and $V_t$ of the neuron,
   wherein a pulse-width of a select gate of the reference cell determines a time each neural cell of the neural array is turned on and the amount of charge removed from the sense-node capacitor,
   wherein when the sense node discharges and reaches a trip point of a detector of the sense node, the detector then provides a pulse signal, and
   wherein the pulse signal is counted by a counter coupled with the detector, wherein the counter registers a set of discharge cycles of the sense node.

2. The system of claim 1, wherein the larger a digital value of $x_i$ causes a longer time for on current.

3. The system of claim 1, wherein the gate-drain connected flash cell configuration of the reference cell provides a control gate (CG) bias.

4. The system of claim 3, wherein the CG comprises a gate of the reference cell and is connected with a drain of the reference cell.

5. The system of claim 3, wherein the gate-drain connected flash cell configuration of the reference cell comprises the control gate bias and the select gate is used to maintain the neuron in question in an on state for a set amount of time.

6. The system of claim 1, a neuron comprises a flash-cell system modelled on attributes of individual neurons and networks of neurons in a nervous system.

7. The system of claim 6, wherein an equation for the neuron comprises: $Eq_{neuron} = \Sigma(x_i * y_i) + b$, wherein $x_i$ is the set of input vectors, $y_i$ is parameter which is related to a threshold voltage of individual flash cells, and b is a bias variable.

8. The system of claim 1, wherein when the pulse signal is counted in the counter, the pulse signal provides a trigger to pre-charge the bitline to $V_{DD}$.

9. The system of claim 1, wherein a plurality of neurons of the array of neurons are placed in an on state.

10. The system of claim 9, wherein based on the width of an input pulse, each neural cell of the neuron is also on for a proportional period, and each current of each neural cell of the neuron continues to change as a function of a width of the input pulse.

11. The system of claim 10, wherein each neural cell of the neuron array has a different threshold value in a specified range of operation of the array of neurons.

12. The system of claim 1, wherein a count of an ADC is a measure of an amount of charge discharged by the bit-line over a set amount of time.

13. The system of claim 12, wherein the count measures a summation of $x_i$ as a CG bias voltage multiplied by $y_i$ as a weight stored as the threshold over a set amount of time.

14. The system of claim 13, wherein the count is based on the integral $\int(x_i * y_i)\, dt$.

15. The system of claim 12, wherein the counting lasts until a longest possible input pulse is over.

16. The system of claim 12, wherein the count is a measure of an average bit line current over a fixed time, which is proportional to a total amount of charge discharged from the capacitor of the sense node over a fixed time period.

17. The system of claim 1, wherein the sense node discharges based on the bit-line current.

18. The system of claim 1, wherein the detector and counter comprises an ADC.

19. The system of claim 1, wherein the ADC attached to the bit-lines is removed in a subset of neural array layers and replaced with a simple current to voltage convertor to bias the control gates of the following neural array layer in a feed-through neural architecture.

20. The system of claim 1:
   wherein a detector reference voltage is adjusted to compensate for any sense-node ramp rate variations between different modes, and
   wherein the detector reference voltage is adjusted to accommodate for any length of input vector, $x_i$.

* * * * *